(12) United States Patent
Lo et al.

(10) Patent No.: US 7,160,755 B2
(45) Date of Patent: Jan. 9, 2007

(54) METHOD OF FORMING A SUBSTRATELESS SEMICONDUCTOR PACKAGE

(75) Inventors: Wai Yew Lo, Selangor (MY); Cheng Choi Yong, Kul (MY); Kong Bee Tiu, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 10 days.

(21) Appl. No.: 11/108,220

(22) Filed: Apr. 18, 2005

(65) Prior Publication Data
US 2006/0234421 A1    Oct. 19, 2006

(51) Int. Cl.
*H01L 21/44* (2006.01)
*H01L 21/48* (2006.01)
*H01L 21/50* (2006.01)

(52) U.S. Cl. .................. 438/106; 257/737
(58) Field of Classification Search .......... 438/64, 438/68, 107, 613; 257/737, 738
See application file for complete search history.

(56) References Cited

U.S. PATENT DOCUMENTS

| 5,969,426 | A |  | 10/1999 | Baba et al. |  |
| 6,080,936 | A | * | 6/2000 | Yamasaki et al. | 174/263 |
| 6,383,838 | B1 |  | 5/2002 | Ryu |  |
| 2002/0017721 | A1 | * | 2/2002 | Huang | 257/724 |
| 2005/0009317 | A1 | * | 1/2005 | Lin | 438/613 |
| 2005/0062152 | A1 | * | 3/2005 | Tsai | 257/737 |

OTHER PUBLICATIONS

International Search Report.

* cited by examiner

*Primary Examiner*—Phuc T. Dang
(74) *Attorney, Agent, or Firm*—Charles Bergere

(57) ABSTRACT

A method of forming a substrateless semiconductor package (10) includes forming a carrier (16) on a base plate (12) and attaching an integrated circuit (IC) die (32) to the carrier (16). The IC die (32) then is electrically connected to the carrier (16). A molding operation is performed to encapsulate the IC die (32), the electrical connections (36) and the carrier (16). Thereafter, the base plate (12) is removed.

17 Claims, 5 Drawing Sheets

METHOD OF FORMING A SUBSTRATELESS SEMICONDUCTOR PACKAGE

BACKGROUND OF THE INVENTION

The present invention relates to the packaging of semiconductor devices in general and more specifically to a method of forming a substrateless semiconductor package.

Lead frames and substrates are conventionally used as a medium for die interconnection. However, apart from additional material and processing costs, there are numerous other drawbacks associated with the use of lead frames and substrates such as, for example, package delamination or cracking due to poor adhesion of lead frames and substrates to plastic molding compounds or differences in coefficients of thermal expansion (CTE) between them. These problems arising from the use of lead frames and substrates for die interconnection compromise the reliability of the resultant semiconductor packages and add to the cost of packaging integrated circuit (IC) dies. Thus, it would be desirable to have an inexpensive method of forming reliable semiconductor packages.

Accordingly, it is an object of the present invention to provide an inexpensive method of fabricating reliable semiconductor packages.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE PREFERRED EMBODIMENTS

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

To achieve the objects and advantages discussed above and others, the present invention provides a method of forming a semiconductor package including the steps of providing a base plate having a plurality of cavities and forming a carrier on the base plate with a solder material. The solder material fills the plurality of cavities, which forms a plurality of solder pillars. Next, an integrated circuit (IC) die is placed on the carrier and electrically connected to the carrier. Finally, a molding operation is performed to encapsulate the IC die, the electrical connections and at least a portion of the carrier. Thereafter, the base plate may be removed.

The present invention further provides a method of forming a plurality of semiconductor packages including the steps of providing a base plate having a plurality of cavities and forming a carrier on the base plate with a solder material, wherein the solder material fills the plurality of cavities thereby forming a plurality of pillars. An integrated circuit (IC) die is placed on the carrier and electrically connected with respective ones of the plurality of pillars. A molding operation is performed to encapsulate the IC die, the electrical connections and at least a portion of the carrier. The molded carrier is then singulated to separate adjacent ones of the IC dies, thereby forming a plurality of semiconductor packages. The base plate may be removed either before or after singulation.

Figure 1:
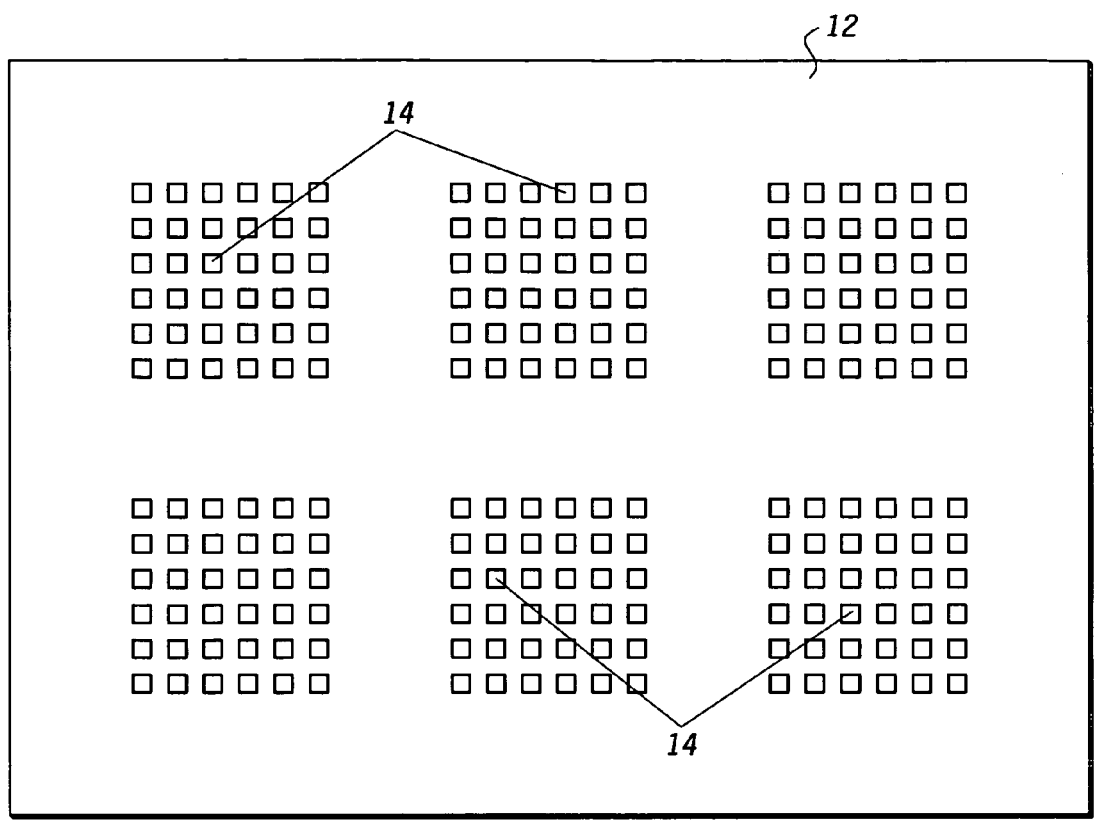
FIG. 1 is an enlarged top plan view of a base plate for the formation of a plurality of substrateless semiconductor packages in accordance with an embodiment of the present invention.

Referring now to FIG. 1, a base plate 12 used to form a plurality of substrateless semiconductor packages is shown. The base plate 12 includes a plurality of cavities 14. In this particular example, the cavities 14 are grouped to form a 2×3 array of cavities 14 on the base plate 12. The cavities 14 in each group are further arranged in a 6×6 matrix. However, those of skill in the art will understand that the present invention is not limited by the arrangement or number of the cavities 14 in the base plate 12. That is, the matrices may be larger or smaller than 6×6 and the number of matrices may be other than 2×3. See for example, a base plate 102 in FIG. 11 described below.

Figure 2:
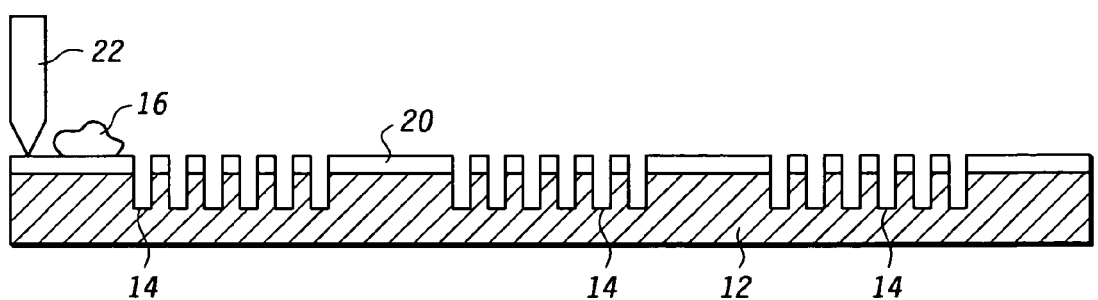
FIGS. 2 and 3 are enlarged cross-sectional views illustrating the formation of a carrier on the base plate of FIG. 1 in accordance with an embodiment of the present invention.
Figure 3:
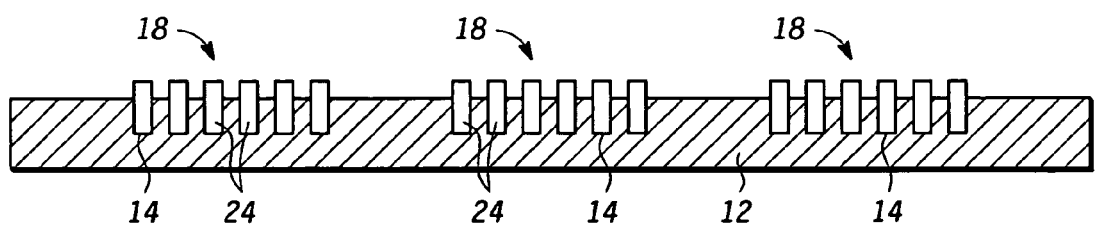

FIGS. 2–4 and 7–10 are enlarged cross-sectional views that illustrate a method of forming substrateless semiconductor packages in accordance with an embodiment of the present invention. FIGS. 2 and 3 illustrate the formation of a carrier 18 made of a solder material 16 on the base plate 12 of FIG. 1.

Referring now to FIG. 2, a stencil 20 is placed over the base plate 12 and a squeegee 22 is used to apply the solder material 16 in a paste form across the stencil 20 to form the carrier 18. For example, a glob of the solder material 16 is deposited on the stencil 20 and then brushed across the stencil 20 with the squeegee 22 so that the solder material 16 fills the cavities 14 in the base plate 12. In one embodiment of the invention, the carrier 18 is printed in two passes to ensure that the stencil 20 and the cavities 14 in the base plate 12 are completely filled with the solder material 16. As an alternative, the solder material 16 could be dispensed using a dispensing system, such as an air or volumetric control dispenser. The solder material 16 may be a eutectic solder, high lead solder or a lead free solder, while the base plate 12 preferably is made of a material that is readily separable from the solder material 16 such as, for example, graphite, stainless steel or aluminum, so that no coatings are required to be put on the base plate 12 to make it readily separable from the solder material 16. Alternatively, coated or non-stick plates can be used. If desired, after applying the solder material 16 to the base plate 12 via the stencil 20, metal plating, such as a copper, gold, silver or like plating, could be formed over the solder material 18 to add rigidity and conductivity to the carrier 18. In this particular example, the base plate 12 has a thickness or height of about 0.56 millimeter (mm), while each of the cavities 14 has a depth of about 0.40 mm and a width of about 0.075 mm. However, it should be understood that the present invention is not limited by the dimensions of the cavities 14, the thickness or height of the base plate 12, or by the material from which the base plate 12 is made. The stencil 20 in this particular example has a thickness of about 3 mils and is made of aluminum. Nonetheless, those of skill in the art will understand that the present invention is not limited by the thickness of the stencil 20 used in the printing process. Rather, the thickness of the stencil 20 is dependent on the degree of separation required between an IC die and the base plate 12 (see standoff $H_{standoff}$ in FIG. 7, described below). For example, a stencil with a thickness of about 2 mils may be used if a smaller degree of separation is required. Conversely, a stencil having a thickness of about 4 mils may be used if greater separation is required. When the solder material 16 has cooled sufficiently to solidify, the stencil 20 is removed.

FIG. 3 shows the carrier 18 formed on the base plate 12 after the stencil 20 has been removed. As can be seen from FIG. 3, the carrier 18 includes a plurality of solder pillars 24 formed in the cavities 14 of the base plate 12. Next, a first reflow process is performed in which the carrier 18 and the base plate 12 are passed through a reflow oven. The heat in the oven melts the carrier 16, i.e., the individual solder pillars 24.

Figure 4:
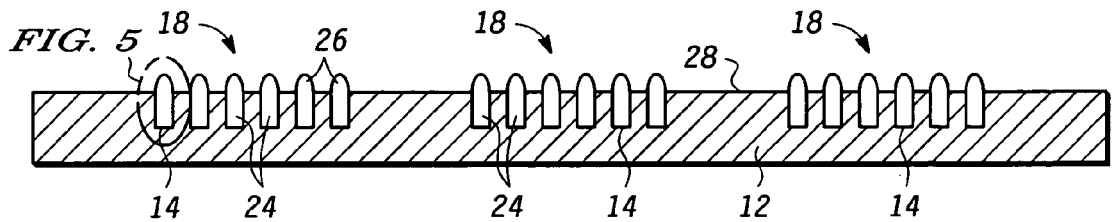
FIG. 4 is an enlarged cross-sectional view of a base plate and a carrier having a plurality of solder bumps in accordance with an embodiment of the present invention.

FIG. 4 shows the base plate 12 and the carrier 18 after the first reflow process. As can be seen, the portions of the carrier 18 extending beyond a top surface 28 of the base plate 12 form a plurality of solder bumps 26 of substantially the same height when cooled.

Figure 5:
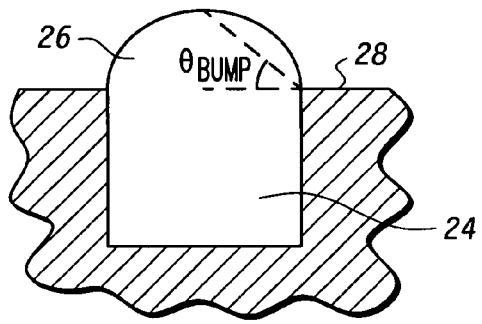
FIG. 5 is an enlarged view of a solder pillar of the carrier of FIG. 4.
Figure 6:
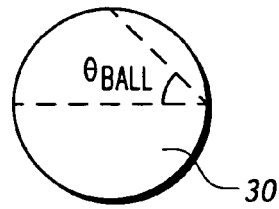
FIG. 6 is an enlarged cross-sectional view of a conventional solder ball.

Referring now to FIGS. 5 and 6, an enlarged cross-sectional view of one of the solder pillars 24, i.e., a portion 5 of the carrier 18 of FIG. 4, is shown in FIG. 5, while an enlarged cross-sectional view of a conventional solder ball 30 is shown in FIG. 6. The solder pillar 24 shown in FIG. 5 includes a solder bump 26, which is that portion of the solder pillar 24 that extends past the top surface 28 of the base plate 12. The solder bump 26 has an angle of inclination $\theta_{bump}$ that varies according to the thickness of the stencil 20 employed in the printing process. In one embodiment, the angle of inclination $\theta_{bump}$ of the solder bump 26 is about 11.3° when a stencil having a thickness of about 3 mils is used, and is about 14.9° when a stencil about 4 mils thick is used. Although rounder when a thicker stencil is used, the solder bump 26 is nevertheless relatively flat when compared to the conventional solder ball 30 in FIG. 6, which has an angle of inclination $\theta_{ball}$ of about 45°. Because the solder bumps 26 are relatively flat, the present invention does not require an additional step of coining to flatten the carrier 18 in preparation for wire bonding. This is advantageous in that not only is the assembly cost reduced by the elimination of the coining step, problems associated with the coining process such as, for example, lack of planarity amongst the coined solder balls and damage to the solder balls caused by the coining process also are avoided.

Figure 7:
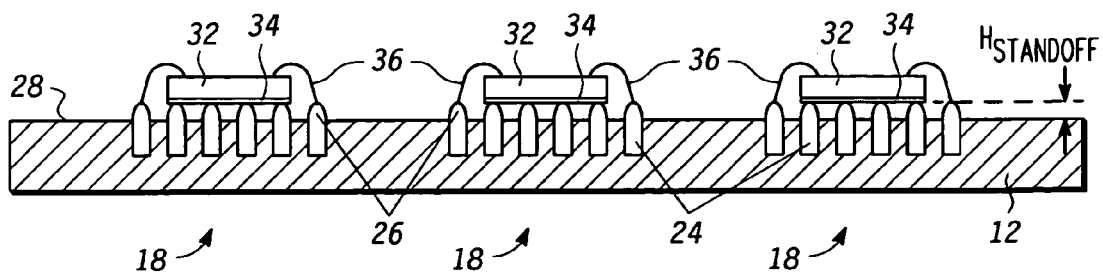
FIG. 7 is an enlarged cross-sectional view of a plurality of semiconductor integrated circuit (IC) dies attached and electrically connected to the carrier of FIG. 4.

Referring now to FIG. 7, a plurality of integrated circuit (IC) dies 32 are attached and electrically connected to the carrier 18. The IC dies 32 may be attached to the carrier 18 in a variety of ways, as known by those of skill in the art, such as with a glue or adhesive material placed on a back surface of the die, or with an adhesive tape. In the present embodiment, the IC dies 32 are attached, such as via lamination, to an adhesive tape 34 such as, for example, a hard, conductive epoxy tape, non-conductive tape or a silicon (Si) tape adhesive, which when placed over the carrier 18 and subjected to heat, attaches the IC die 32 to the carrier 18. In this particular example, a standoff $H_{standoff}$ of about 0.075 mm is maintained between opposing surfaces of the hard adhesive tape 34 and the base plate 12. However, it should be understood that the standoff $H_{standoff}$ is dependent on the thickness of the stencil 20 used in the printing process, that is, the standoff $H_{standoff}$ is greater when a thicker stencil is used and, conversely, lesser when a thinner stencil is used. For example, a standoff $H_{standoff}$ of about 0.10 mm is maintained when the stencil 20 used in the printing process is about 4 mils thick. The IC dies 32 may be processors, such as digital signal processors (DSPs), special function circuits, such as memory address generators, or circuits that perform any other type of function. The IC dies 32 are not limited to a particular technology such as CMOS, or derived from any particular wafer technology. Further, the present invention can accommodate various die sizes, as will be understood by those of skill in the art. A typical example is a memory die having a size of about 15 mm by 15 mm. Although FIGS. 7–10 show only three (3) dies being attached, it will be understood that more or fewer dies may be attached to the carriers 18, depending on the size of the carrier 18, the size of the IC dies 32, and the required functionality of the resulting substrateless semiconductor packages. Within an IC package there may be multiple dies bonded on the same planar solder pillar surface, arranged side by side and interconnected to one another. In this particular example, the IC dies 32 are electrically connected to the carriers 18 with a plurality of wires 36. The wires 36 connect bonding pads on the IC dies 32 to respective ones of the solder bumps 26. A known wirebonding process is used to make the electrical connections. Nevertheless, it should be understood that the present invention is not limited to wire bond type connections. In alternative embodiments, the IC dies 32 may, for example, be electrically connected to the carrier 18 via flip chip bumps (see FIGS. 12–15). The wires 36 may be made of gold (Au) or other electrically conductive materials as are known in the art and commercially available. As can be seen from FIG. 7, the carrier 18 serves as a medium for die interconnection. Thus, there is no need for the provision of a lead frame or a substrate. Accordingly, the problems attendant upon the use of lead frames and substrates such as, for example, package delamination or cracking can be avoided with the present invention.

Figure 8:
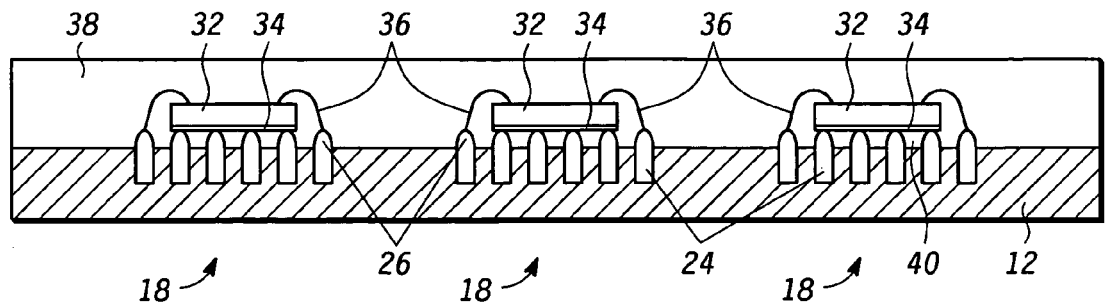
FIG. 8 is an enlarged cross-sectional view of the IC dies of FIG. 7 encapsulated by a mold compound.

Referring now to FIG. 8, the IC dies 32, the wire bonded wires 36 and the solder bumps 26 of the carriers 18 are encapsulated by a mold compound 38. A molding operation such as, for example, an injection molding process may be used to perform the encapsulation. The mold compound 38 is preferably a fine filler molding compound so that a space 40 between the hard adhesive tapes 34 and the solder bumps 26 can be filled, and the IC dies 32, the wire bonded wires 36 and the solder bumps 26 of the carrier 18 encapsulated in a one-step molding operation, thereby reducing the number of processing steps involved. Once the mold compound 38 has cooled sufficiently to solidify, the base plate 12 is removed.

Figure 9:
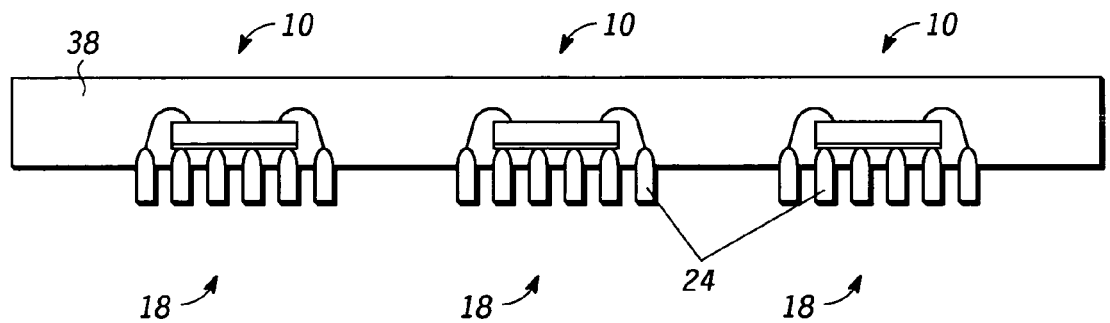
FIG. 9 is an enlarged cross-sectional view of a plurality of substrateless semiconductor packages formed in accordance with an embodiment of the present invention.

FIG. 9 shows three substrateless semiconductor packages 10 after the removal of the base plate 12 and prior to a singulation operation. As can be seen, the solder pillars 24 are exposed after the base plate 12 is removed. In a further embodiment of the present invention, a second reflow process is performed on the carriers 18.

Figure 10:
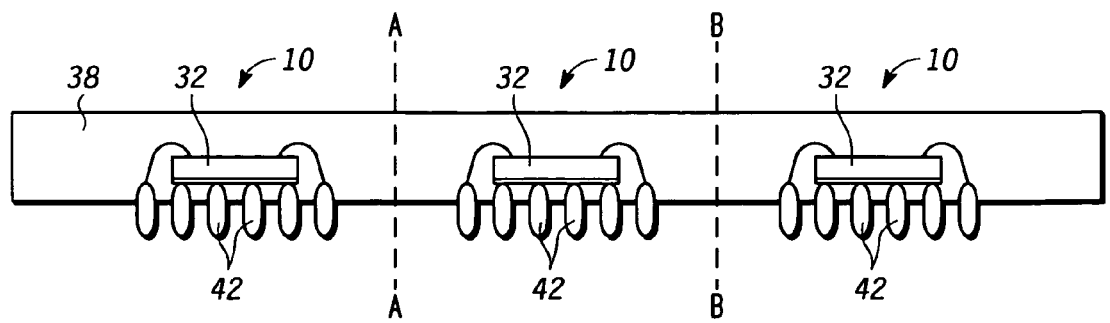
FIG. 10 is an enlarged cross-sectional view of a plurality of substrateless semiconductor packages formed in accordance with the present invention.

Referring to FIG. 10, a plurality of substrateless semiconductor packages 10 is shown. FIG. 10 shows the substrateless semiconductor packages 10 after the second reflow process. The solder pillars 24 in FIG. 9 are melted during the second reflow process. When cooled, the solder pillars form a plurality of solder globules 42. The solder globules 42 are preferably akin to Controlled collapse chip carrier connection (C5) type interconnections. Hence, unlike conventional packaging processes, the present invention does not require additional processing steps to attach separate C5 solder balls to the substrateless semiconductor packages 10. The present invention also circumvents the problems associated with the attachment of separately formed C5 solder balls such as, for example, inconsistent C5 solder ball diameters, missing C5 solder balls, bridging C5 solder balls and C5 solder balls non-stick on pad due to pad contamination. Additionally, the cycle time for each printing operation from loading to paste printing is shorter than the cycle time for a typical solder ball placement process.

Adjacent ones of the IC dies 32 may then be separated along the vertical lines A—A and B—B via a singulating operation such as, for example, saw singulation to form individual substrateless semiconductor packages 10. The singulating step is preferably performed after the second reflow process. However, those of skill in the art will understand that the singulating step can be performed before the second reflow process, and singulation even could be performed before the base plate 12 is removed.

FIGS. 11–15 illustrate a method of forming a plurality of substrateless semiconductor packages 100 in accordance with another embodiment of the present invention.

Figure 11:
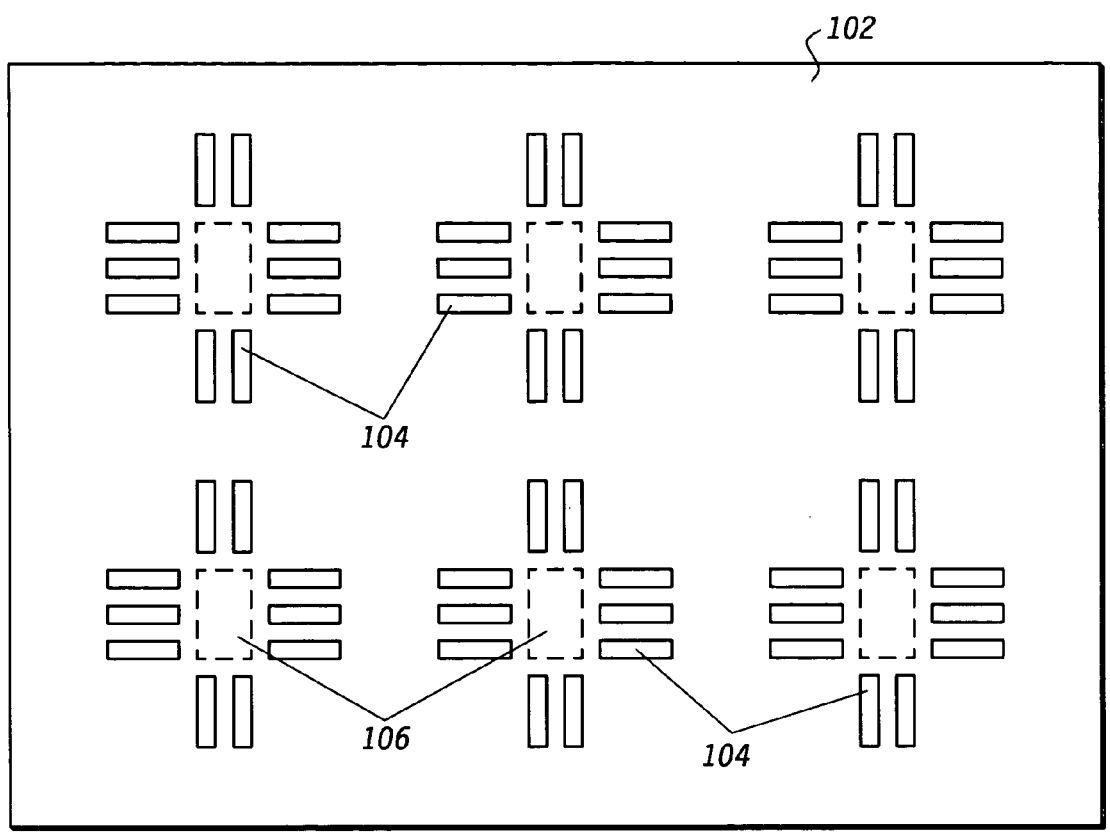
FIG. 11 is an enlarged top plan view of a base plate for the formation of a plurality of substrateless semiconductor packages in accordance with another embodiment of the present invention.

Referring now to FIG. 11, a top plan view of a base plate 102 for the formation of the substrateless semiconductor packages 100 is shown. The base plate 102 includes a plurality of cavities 104. In this particular example, the cavities 104 are grouped to form a 2×3 array of cavities 104 on the base plate 102. The cavities 104 in each group are further arranged around respective ones of a plurality of die support areas 106. In this particular example, the base plate 102 has a height or thickness of about 0.56 mm, while each cavity 104 has a depth of about 0.40 mm. However, it should be understood that the present invention is not limited by the dimensions of the base plate 102 or by that of the cavities 104. As addressed earlier, those of skill in the art will understand that the present invention is not limited by the arrangement, shape, or number of the cavities 104. The base plate 102 may be constructed of graphite or aluminum boat, which can be recycled.

Figure 12:
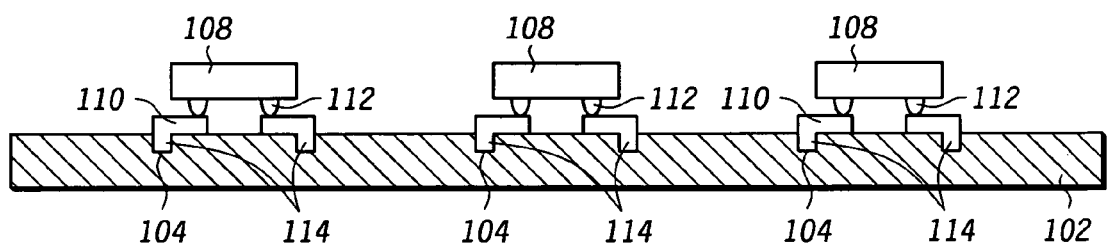
FIG. 12 is an enlarged cross-sectional view a plurality of IC dies attached and electrically connected to a carrier printed on the base plate of FIG. 11.

As previously discussed with reference to FIGS. 2–4, a stencil is placed over the base plate 102 and a plurality of carriers 110 is formed. For the base plate 102, six carriers 110 are formed because there is a 2×3 array of groups of the cavities 104. Referring now to FIG. 12, a cross-sectional view of the base plate 102 having a plurality of solder pillars 114 formed in the cavities 104 is shown. The groups of solder pillars 114 define carriers 110. The solder pillars 114 in this embodiment are L-shaped to facilitate a flip-chip die attach process. The L-shaped pillars 114 are easily formed using a stencilling operation as discussed with reference to FIGS. 2–4. A plurality of IC dies 108 having flip chip bumps 112 are attached to respective ones of the carriers 110 with the flip chip bumps 112 contacting the solder pillars 114.

The IC dies 108 may be processors, such as digital signal processors (DSPs), special function circuits, such as memory address generators, or circuits that perform any other type of function. The IC dies 108 are not limited to a particular technology such as CMOS, or derived from any particular wafer technology. Further, the present invention can accommodate various die sizes, as will be understood by those of skill in the art. Although FIGS. 12–15 show only three (3) dies each, it will be understood that more or fewer dies may be attached to the carriers 110, depending on the size of the carriers 110, the size of the IC dies 108, and the required functionality of the resulting substrateless semiconductor packages 100. The IC dies 108 may be attached and electrically connected to the carriers 110 by gang placement of the IC dies 108 on the carriers 110, followed by a first reflow process. Holes or dimples (not shown) may be provided on the carriers 110 to secure the flip chip bumps 112 in place during the first reflow process. The flip chip bumps 112 form controlled collapse chip connection (C4) type interconnections. It will be noted that there is no need for the provision of a lead frame or substrate as a medium for die interconnection since the carrier 110 provides such a function. Accordingly, the number of processing steps and assembly cost are reduced and the problems attendant upon the use of lead frames and substrates can be avoided.

Figure 13:
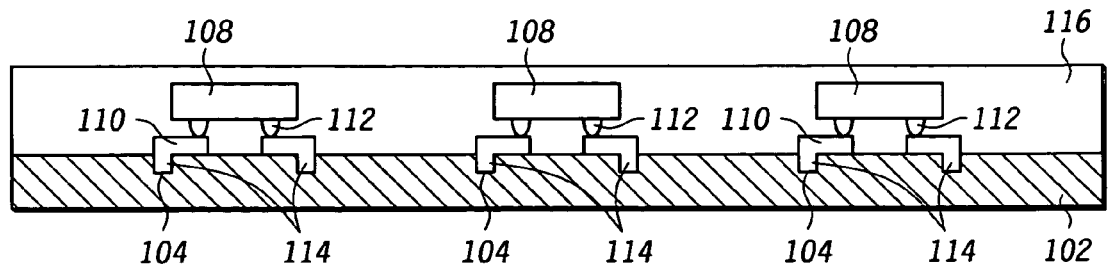
FIG. 13 is an enlarged cross-sectional view of the IC dies of FIG. 12 encapsulated by a mold compound.

Referring now to FIG. 13, the IC dies 108, the flip chip bumps 112 and the carriers 110 are encapsulated by a mold compound 116 such as by an injection molding operation. The mold compound 116 is preferably a fine filler molding compound so that the IC dies 108, the flip chip bumps 112 and the carrier 110 can be encapsulated in a one-step molding operation to further reduce the number of processing steps required. Once the mold compound 116 has cooled sufficiently to solidify, the base plate 102 is removed.

Figure 14:
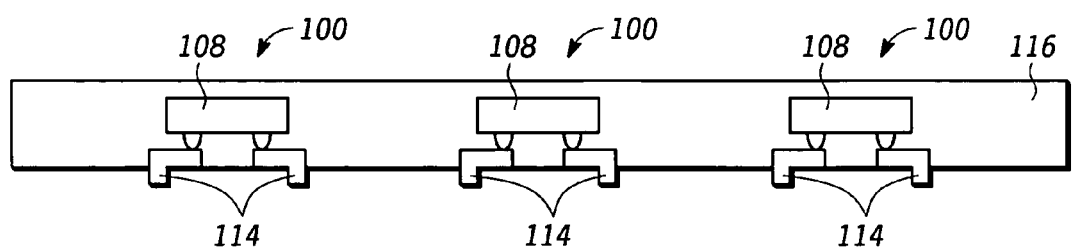
FIG. 14 is an enlarged cross-sectional view of a plurality of substrateless semiconductor packages formed in accordance with an embodiment of the present invention.

FIG. 14 shows the substrateless semiconductor packages 100 after the removal of the base plate 102. As can be seen, the solder pillars 114 are exposed once the base plate 102 is removed. A second reflow process may be performed on the substrateless semiconductor packages 100 of FIG. 14 in accordance with a further embodiment of the present invention.

Figure 15:
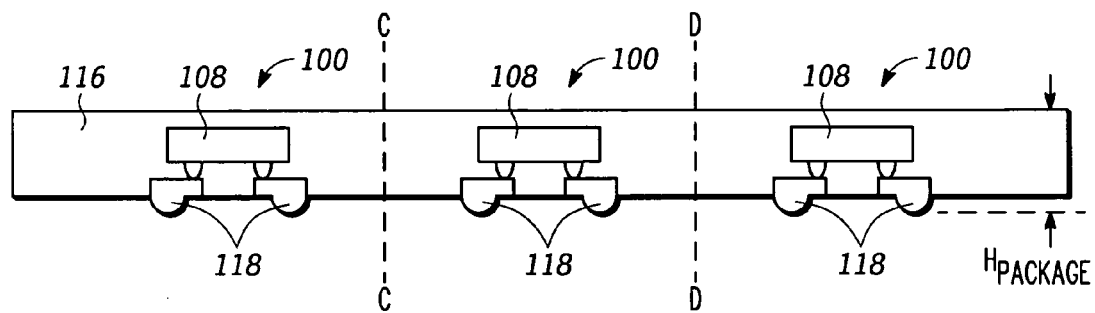
FIG. 15 is an enlarged cross-sectional view of a plurality of substrateless semiconductor packages formed in accordance with a further embodiment of the present invention.

FIG. 15 shows the substrateless semiconductor packages 100 after the second reflow process. The heat in the reflow oven melts the solder pillars 114. When cooled, the solder pillars 114 form a plurality of solder globules 118. Controlled collapse chip carrier connection (C5) type interconnections may be formed from the solder globules 118. Hence, unlike conventional packaging processes, the present invention does not require additional processing steps to attach expensive C5 solder balls. This reduces assembly costs and avoids the problems associated with the use of C5 solder balls.

Adjacent ones of the IC dies 108 may then be separated along the vertical lines C—C and D—D via a singulating operation such as, for example, saw singulation to form individual substrateless semiconductor packages 100. The singulating step is preferably performed after the second reflow process. However, the singulating step can also be performed after the base plate 102 is removed from the substrateless semiconductor packages 100 of FIG. 14 and before the second reflow process. In this particular example, the encapsulated IC die 108 has a height or thickness of about 0.80 mm, while each of the substrateless semiconductor packages 100 has a height or thickness $H_{package}$ of about 1.2 mm. However, it should be understood that the present invention is not limited by the dimensions of the encapsulated IC dies 108 or by that of the substrateless semiconductor packages 100.

Although the IC dies 108 in FIGS. 13–15 are completely encapsulated, the tops of the IC dies may be co-planar with the tops of the encapsulated packages in other embodiments of the present invention. The substrateless semiconductor packages 100 may be non-leaded, Ball Grid Array (BGA) or flip chip Quad Flat No-Lead (QFN) type packages.

As is evident from the foregoing discussion, the present invention provides an inexpensive method of forming reliable semiconductor packages by doing away with the use of lead frames and substrates for die interconnection and by eliminating conventional processing steps such as C5 solder ball attachment, coining and underfilling. Because the present invention can be implemented using current semiconductor assembly equipment, there is no need for additional capital investment. Additionally, the semiconductor packages formed with the present invention have relatively low profiles, such as down to about 1.2 mm, as compared to conventional flip chip packages, which are about 2.5 mm thick. Further, the present invention achieves high throughput by printing a carrier having a plurality of solder globules from which C5 type interconnections may be formed, instead of relying on conventional C5 solder ball attachment processes.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A method of forming a semiconductor package, the method comprising:
   providing a base plate having a plurality of cavities;
   forming a carrier on the base plate with a solder material, wherein the solder material fills the plurality of cavities thereby forming a plurality of pillars;
   placing an integrated circuit (IC) die on the carrier;
   electrically connecting the IC die and the carrier;
   performing a molding operation to encapsulate the IC die, the electrical connections and at least a portion of the carrier; and
   removing the base plate after performing the molding operation, wherein distal ends of the pillars are exposed.

2. The method of forming a semiconductor package of claim 1, wherein the solder material is printed on the base plate in two passes.

3. The method of forming a semiconductor package of claim 2, wherein the solder material is one of a eutectic solder, high lead solder and a lead free solder.

4. The method of forming a semiconductor package of claim 2, wherein the solder material is printed on the base plate with a stencil.

5. The method of forming a semiconductor package of claim 4, wherein the stencil has a thickness of less than about 4 mils.

6. The method of forming a semiconductor package of claim 1, wherein the base plate is made of a material that is separable from the solder material.

7. The method of forming a semiconductor package of claim 6, wherein the base plate material is one of graphite, aluminum and stainless steel.

8. The method of forming a semiconductor package of claim 7, wherein the base plate has a thickness of less than about 1 millimeters (mm).

9. The method of forming a semiconductor package of claim 8, wherein each of the plurality of cavities has a depth of about 0.40 mm.

10. A method of forming a semiconductor package, comprising:
    providing a base plate having a plurality of cavities;
    forming a carrier on the base plate with a solder material, wherein the solder material fills the plurality of cavities thereby forming a plurality of solder pillars;
    attaching an integrated circuit (IC) die on the carrier;
    electrically connecting bonding pads of the IC die with respective ones of the solder pillars that surround the IC die;
    performing a molding operation to encapsulate the IC die, the electrical connections and a portion of the carrier; and
    reflowing the plurality of pillars to form a plurality of solder globules.

11. The method of forming a semiconductor package of claim 10, wherein controlled collapse chip carrier connection (C5) type interconnections are formed from the plurality of solder globules.

12. The method of forming a semiconductor package of claim 1, wherein the electrical connection between the IC die and the carrier is by wire bonding.

13. The method of forming a semiconductor package of claim 1, wherein the IC die is attached to the carrier using an adhesive tape.

14. The method of forming a semiconductor package of claim 13, wherein a standoff of about 0.075 mm is maintained between opposing surfaces of the adhesive tape and the base plate.

15. The method of forming a semiconductor package of claim 1, wherein the electrical connection between the IC die and the carrier is by flip chip bonding.

16. The method of forming a semiconductor package of claim 10, further comprising the step of removing the base plate after performing the molding operation such that distal ends of the pillars are exposed.

17. A method of forming a plurality of semiconductor packages, comprising:
    providing a base plate having a plurality of cavities;
    forming a carrier on the base plate with a solder material, wherein the solder material fills the plurality of cavities thereby forming a plurality of pillars;
    placing a plurality of integrated circuit (IC) dies on the carrier;
    electrically connecting the IC dies with respective ones of the plurality of pillars;

performing a molding operation to encapsulate the IC dies, the electrical connections and at least a portion of the carrier; and removing the base plate to expose distal ends of the pillars; and performing a singulating operation to separate adjacent ones of the plurality of IC dies, thereby forming a plurality of semiconductor packages.

* * * * *